United States Patent [19]
Hirooka et al.

[11] Patent Number: 4,798,809
[45] Date of Patent: * Jan. 17, 1989

[54] PROCESS FOR PREPARING PHOTOELECTROMOTIVE FORCE MEMBER

[75] Inventors: Masaaki Hirooka, Toridie; Shunichi Ishihara, Ebina; Junichi Hanna; Isamu Shimizu, both of Yokohama, all of Japan

[73] Assignee: Canon Kabushiki Kaisha, Tokyo, Japan

[*] Notice: The portion of the term of this patent subsequent to Jun. 14, 2005 has been disclaimed.

[21] Appl. No.: 938,996

[22] Filed: Dec. 8, 1986

[30] Foreign Application Priority Data

Dec. 11, 1985 [JP] Japan .................. 60-277004

[51] Int. Cl.$^4$ ...................... H01L 31/18; H01L 21/20
[52] U.S. Cl. ........................ 437/4; 136/258; 427/74; 437/100; 437/101
[58] Field of Search ............... 136/258 AM; 357/30, 357/59 C, 59 D; 148/174; 427/74, 86; 423/349; 430/128; 437/4, 100, 101

[56] References Cited

U.S. PATENT DOCUMENTS

| Re. 31,708 | 10/1984 | Gordon | 427/126.2 |
|---|---|---|---|
| 3,473,978 | 10/1969 | Jackson et al. | 437/93 |
| 3,888,705 | 6/1975 | Fletcher et al. | 437/107 |
| 4,146,657 | 3/1979 | Gordon | 427/106 |
| 4,239,811 | 12/1980 | Kemlage | 437/238 |
| 4,357,179 | 11/1982 | Adams et al. | 437/19 |
| 4,402,762 | 9/1983 | John et al. | 437/16 |
| 4,421,592 | 12/1983 | Shaskus et al. | 156/613 |
| 4,448,801 | 5/1984 | Fukuda et al. | 427/39 |
| 4,459,163 | 7/1984 | MacDiarmid et al. | 148/174 |
| 4,462,847 | 7/1984 | Thompson et al. | 437/99 |
| 4,504,518 | 3/1985 | Ovshinsky et al. | 437/81 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 X |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |

FOREIGN PATENT DOCUMENTS

| 74212 | 3/1983 | European Pat. Off. |
|---|---|---|
| 90586A | 10/1983 | European Pat. Off. |
| 58-168215 | 10/1983 | Japan | 136/258 AM |
| 59-199035 | 12/1984 | Japan |
| 60-43819 | 8/1985 | Japan |
| 2038086A | 7/1980 | United Kingdom |
| 2148328A | 5/1985 | United Kingdom |

OTHER PUBLICATIONS

H. Matsumura et al, *Conference Record, 18th IEEE Photovoltaic Specialists Conf.* (Oct. 1985), published Apr. 1986, pp. 1277–1282.
Brodsky et al., IBM Technical Disclosure Bulletin, vol. 22, p. 3391 (Jan. 1980).
Inoue, *Appl. Phys. Lett.* (43(8) Oct. 15, 1983, p. 774.
Ohnishi et al., Proceedings, 6th E.C. Photovoltaic Solar Energy Conference, London, Apr. 15–19, 1985, pp. 682–686.
Sakai et al., Proceedings, 6th E.C. Photovoltaic Solar Energy Conference, London, Apr. 15–19, 1985, pp. 677–681.

*Primary Examiner*—Aaron Weisstuck
*Attorney, Agent, or Firm*—Fitzpatrick, Cella, Harper & Scinto

[57] ABSTRACT

An improved photoelectromotive force member having desired photoelectric conversion layer prepared by the use of a substance capable of contributing to form a deposited film and an electronically oxidizing agent in the absence of a plasma. A process and an apparatus for preparing the same.

6 Claims, 4 Drawing Sheets

(A)

(B)

(C)

PROCESS FOR PREPARING PHOTOELECTROMOTIVE FORCE MEMBER

FIELD OF THE INVENTION

This invention relates to an improved photoelectromotive force member using an amorphous material, a process, and an apparatus for preparinq the same.

BACKGROUND OF THE INVENTION

There have been proposed a number of photoelectromotive force members having a photoelectric conversion layer composed of a non crystalline material containing silicon atoms as the main component, namely the so called amorphous silicon (hereinafter referred to as "a-Si") for use in photovoltaic devices and the like.

There have also been proposed various methods for the preparation of such a photoelectric conversion layer using vacuum evaporation, thermo chemical vapor deposition, plasma chemical vapor deposition, reactive sputtering, ion plating and photo chemical vapor deposition techniques.

Among those methods, the method using plasma vapor deposition (hereinafter referred to as "plasma CVD method") has been generally recognized as being the most preferred and is currently used to manufacture the photoelectric conversion layer.

However, for any of the known photoelectric conversion layers, even if it is an acceptable one that is obtained by the plasma CVD method and exhibits fairly satisfactory characteristics, there still remain problems unsolved with respect to obtaining totally satisfactory characteristics, particularly electric and optical characteristics, photoconductive characteristics, deterioration resistance upon repeated use and use environmental characteristics, its homogeneity, reproducibility, mass-productivity, and its long term stability and durability, which are required for the photoelectric conversion layer to be a stable one.

The reasons for the above are largely due to the fact that the photoelectric conversion layer cannot be easily prepared by a simple layer deposition procedure; rather great skill is required in the process operations in order to obtain a desirable photoelectric conversion layer while having due concern for the starting materials.

For example, in the case of forming a film composed of an a-Si material according to the thermo chemical vapor deposition technique (hereinafter referred to as "CVD method"), after the gaseous material containing silicon atoms is diluted, appropriate impurities are introduced thereinto and the thermal decomposition of related materials is carried out at an elevated temperature between 500° and 650° C. Therefore, in order to obtain a desirable a-Si film by the CVD method, precise process operation and control are reguired, and because of this the apparatus in which the process according to the CVD method is practiced becomes complicated and costly. However, even in that case, it is extremely difficult to reproducibly obtain on an industrial scale a desirable homogeneous photoelectric conversion layer composed of an a-Si material having practically applicable characteristics.

Now, although the plasma CVD method is widely used nowadays as above mentioned, it is still accompanied with problems relating to process operations and capital investment.

Regarding the former problems, the operating conditions to be employed under the plasma CVD method are much more complicated than the known CVD method, and it is extremely difficult to generalize them.

That is, there already exist a number of variations even in correlated parameters concerning the temperature of the substrate, the amount and flow rate of gases to be introduced, the degree of pressure and the high frequency power for forming the layer, the structure of the electrodes, the structure of the reaction chamber, the flow rate of gases to be exhausted, and the plasma generation system. Besides said parameters, there also exist other kinds of parameters. Under these circumstances, in order to obtain a desirable deposited film product it is required to choose precise parameters from a great number of variables. And sometimes serious problems occur. For instance, because of the precisely chosen parameters, a plasma is apt to be in an unstable state which causes problems in the deposited film.

Also, the structure of the apparatus in which the process using the plasma CVD method is practiced will eventually become complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters still exist even for such apparatus and the relevant parameters must be precisely chosen from the existing various parameters for the mass-production of such films. In accordance with such precisely chosen parameters, the process must then be carefully practiced.

Against this background, there is an increased demand to stably provide a relatively inexpensive photoelectromotive force member having a photoelectric conversion layer of large area and composed of an a-Si material which has a good uniformity and many practically applicable characteristics and which is suited for its particular application.

Consequently there is an earnest desire to develop an appropriate method and apparatus to satisfactorily meet the above demand.

Likewise, there is a similar situation which exists with respect to other kinds of non-monocrystalline semiconducting layers which may constitute the photoelectric conversion layer of a photoelectromotive force member, for example, those composed of an a-Si material containing at least one selected from oxygen atoms, carbon atoms, and nitrogen atoms.

SUMMARY OF THE INVENTION

The present inventors have conducted extensive studies in order to solve the problems in the aforementioned known methods and in order to develop a new process for effectively and simply preparing an improved photoelectromotive force member having a desirable photoelectric conversion layer composed of a non-crystalline semiconducting material, which has a wealth of practically applicable characteristics, without depending upon any known method and which meets the above mentioned demands.

As a result, the present inventors finally have found a process that enables one to efficiently and stably prepare said photoelectromotive force member in simplified particular procedures as detailed below.

It is therefore an object of this invention to provide an improved photoelectromotive force member provided with a desirable photoelectric conversion layer composed of a non-crystalline semiconducting material which has many practically applicable characteristics, excellent photoelectric conversion functions, and which is prepared without plasma reaction.

Another object of this invention is to provide a process for preparing the improved photoelectromotive force member by which the photoelectric conversion layer can be mass-produced with simplified film forming conditions in a film forming space without plasma discharge while maintaining the characteristics of the film to be formed and promoting the film forming rate.

A further object of this invention is to provide an apparatus suitable for practicing the present process.

These and other objects, as well as the features of this invention will become apparent by reading the following descriptions of preferred embodiments according to this invention while referring to the accompanying drawings.

BRIEF DESCRIPTION OF THE DRAWINGS

FIGS. 1(A) through 1(C) are schematic cross sectional views illustrating representtive embodiments of the photoelectromotive force member according to this invention, in which FIG. 1(A) is a cross-sectional view of a first representative embodiment of the photoelectromotive force member as a photovoltaic device;

FIG. 1(B) is a cross-sectional view of a second representative embodiment of the photoelectromotive force member as a photovoltaic device; and FIG. 1(C) is a cross sectional view of a third representative embodiment of the photoelectromotive force member as a photovoltaic device;

DESCRIPTION OF THE INVENTION

Figure 1:
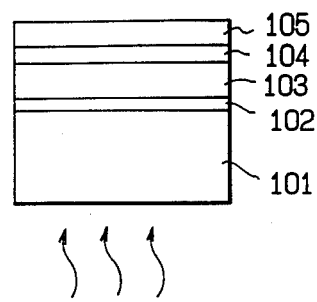
Figure 1:
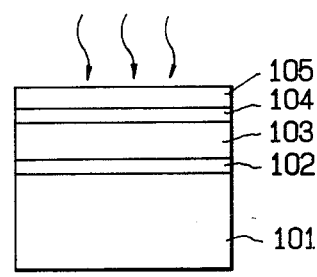
Figure 1:
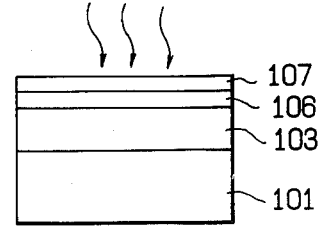

The present inventors have made earnest studies for overcoming the foregoing problems of the conventional photoelectromotive force member and attaining the objects as described above and, as a result, have accomplished this invention based on the findings as described below.

That is, (i) a substance which can be a constituent for forming a photoelectric conversion layer but which does not or can hardly contribute to the formation of said layer as long as it remains in its original energy state and (ii) another substance which can chemically react with the substance (i) to electronically oxidize it (which means that the atom, ion or molecule of the substance loses an electron, namely the oxidation number is increased) are selected, and the two substances in gaseous state are separately introduced through respective transporting passages into a film forming space wherein a substrate for the photoelectromotive member is maintained at a temperature from 200° C. to 300° C. is placed, thereby letting the two substances collide and contact to cause a chemical reaction between the two substances in the space positioned above the substrate in the film forming space.

As a result, there is formed a homogeneous deposited film with a uniform thickness without accompaniment of any solid particles on the substrate.

It is found that the resulting deposited film has a wealth of desirable electric and optical properties and is uniformly accompanied with an excellent photoelectric conversion function.

When a photoelectromotive force member is prepared in accordance with the above procedures, there is obtained a desirable photoelectromotive force member having many practically applicable characteristics such as electric and optical characteristics, deterioration resistance upon repeated use and use-environmental characteristics and having an excellent photoelectric conversion function. As a result, it was confirmed that this method is of sufficient repeatability.

This invention has been completed based on these findings, and it includes an improved photoelectromotive force member, a process, and an apparatus for preparing the same.

Representative embodiments of ths invention will now be detailed referring to the drawings. The description is not intended to limit the scope of the invention.

The photoelectromotive force member is basically represented by those embodiments shown in FIG. 1(A) through FIG. 1(C).

The photoelectromotive force member shown in FIG. 1(A) is of the type wherein light irradiation is conducted from the substrate side and is suited for use in a photovoltaic device.

Referring to FIG. 1(A), there are shown substrate 101, semiconducting layer (p-type or n-type) 102, i-type semiconducting layer 103, semiconducting layer (n-type or p-type) 104, and conductive layer 105.

The photoelectromotive force member shown in FIG. 1(B) is of the same type as shown in FIG. 1(A) except that light irradiation is conducted from the conductive layer 105 side. This photoelectromotive force member is also suited for use in a photovoltaic device.

The photoelectromotive force member shown in FIG. 1(C) has an i-type semiconducting layer (photoconductive layer), an insulative layer and a metallic layer, and is of the type wherein light irradiation is conducted from the side of the metallic layer. This photoelectromotive force member is also suited for use in a photovoltaic device.

Referring to FIG. 1(C), there are shown substrate 101, i-type semiconducting layer 103, insulative layer 106 and metallic layer 107.

In any of the photoelectromotive force members shown in FIG. 1(A) through FIG. 1(C), the substrate 101 may be either electroconductive or electrically insulative. The shape of the substrate 101 may be optionally determined. Examples of the shape are drum, belt, plate and the like.

The thickness of the substrate is optional. But it is usually not less than 10 microns from the view points of the fabrication and handling or mechanical strength of the substrate. The substrate 101 may be either transparent or opaque. In the case when substrate 101 is transparent, the conductive layer 105 may be opaque and light radiation is conducted from the side of the substrate 101 as shown in FIG. 1(A). In the case when the substrate 101 is opaque, the conductive layer 105 is optically transparent and the light radiation is conducted from the side of the conductive layer 105 as shown in FIG. 1(B).

Usable as the electroconductive substrate are, for example, metals such as Al, Cr, Mo, Au, Ir, Nb, Ta, V, Ti, Pt, Pd and the like, or alloys such as NiCr, stainless steel or alloys of said metals.

Usable as the electrically insulating substrate are, for example, films or sheets of synthetic resin such as polyester, polyethylene, polycarbonate, cellulose acetate, polypropylene, polyvinyl chloride, polyvinylidene chloride, polystyrene, polyamide and the like, or glass or ceramics. For the electrically insulating substrate, it is desirable that at least one surface thereof is made conductive and a relevant layer is formed on the conductive surface of the substrate.

For example, in the case of glass, its surface may be conductivized by applying a thin layer of a metal or metal oxide such as NiCr, Al, Cr, Mo, Au, Ir, Nb, Ta, V, Ti, Pt, Pd, $In_2O_3$, $SnO_2$, ITO ($In_2O_3+SnO_2$), etc. In the case of a synthetic resin film such as polyester film etc., its surface may be made conductive with a metal such as NiCr, Al, Ag, Pd, Zn, Ni, Au, Cr, Mo, Ir, Nb, Ta, V, Ti, Pt, etc. by means of a vacuum vapor deposition technique, an electron beam vapor deposition technique or a sputtering technique. Its surface may also be made conductive by laminating it with one of said metals.

The semiconducting layer 102 in the photoelectromotive force members as shown in FIG. 1(A) and FIG. 1(B) is composed of an amorphous silicon material containing silicon atoms (Si) as the main component and at least one selected from hydrogen atoms (H) and halogen atoms (X)(hereinafter referred to as "a-Si(H,X)").

And in the case when the semiconducting layer is of p-type, it further contains p-type impurities to impart p-type conduction.

Further in the case of the photoelectromotive force member as shown in FIG. 1(A), where light irradiation is conducted from the side of the substrate 101, the semiconducting layer 102 is desired to permit the so called window-effect.

In that case, the semiconducting layer 102 is composed of a wide band gap amorphous silicon material containing at least one selected from oxygen atoms (O), carbon atoms (C) and nitrogen atoms (N) as a band-gap adjusting element and p-type impurities in a Si(H,X) (hereinafter referred to as "a-Si(H,X)(O,C,N)").

On the other hand, in the case of the photoelectromotive force member as shown in FIG. 1(B) wherein that light irradiation is conducted from the side of the electroconductive layer 105, the semiconducting layer is of n-type conduction, and therefore contains n-type impurities.

In any case, the thickness of the semiconducting layer 102 is preferably 30 Å to $1\times10^4$ Å, more preferably 50 Å to $5\times10^3$ Å, and, most preferably, 50Å to $1\times10^3$ Å.

As the p-type impurity to be used for making the semiconducting layer 102 p-type, there are, for example, elements of Group IIIA of the Periodic Table such as B, Al, Ga, In, Tl and the like. Among these elements, B and Ga are most preferred.

As the n-type impurity to be used for making the semiconducting layer 102 n-type, there are, for example, elements of Group VA of the Periodic Table such as N, P, As, Sb, Bi and the like. Among these elements, As, P and Sb are most preferred.

The incorporation of these p-type or n-type impurities into the semiconducting layer 102 is carried out by doping the layer with relevant impurities during its formation process. The amount of such impurities incorporated into the semiconducting layer 102 is appropriately determined having due regard to the related factors required for that layer such as electric characteristics, optical characteristics and the like. Commonly, it is less than $3\times10^{-2}$ atomic % for the p-type impurity and $5\times10^{-3}$ atomic % for the n-type impurity.

Now, for the i-type semiconducting layers 103 in the photoelectromotive force member as shown in FIG. 1(A) and FIG. 1(B) and also for the photoconductive layer 103 in the photoelectromotive force member as shown in FIG. 1(C), they are of a multi-layer structure possessing a multi-band gap and have photoconductive characteristics to bring about a sufficient photoelectromotive function.

Each of the i-type layers comprises a region constituted by an amorphous silicon material containing silicon atoms (Si), nitrogen atoms (N) as a band-gap adjusting element, and at least one selected from hydrogen atoms (H) and halogen atoms (X)(hereinafter referred to as "a-SiN (H,X)"), a region constituted by a Si (H, X) and/or a region constituted by an amorphous silicon material containing silicon atoms (Si), germanium atoms (Ge), and at least one selected from hydrogen atoms (H) and halogen atoms (X) (hereinafter referred to as "a-SiGe (H,X)"). The thickness of these i-type semiconducting layers is determined appropriately having due regard to the related factors not only in the relationship between the thickness of the p-type semiconducting layer and the thickness of the n-type semiconducting layer but also in the quantitive relationship between the amount of the impurities with which the p-type semiconducting layer is doped and the amount of the impurities with which the n-type semiconducting layer is doped so as to make the most of each of the functions of the three layers concerned. However, in the usual case, the thickness of the i-type semiconductive layer is preferred to be several times to tens of times as much as that of the p-type semiconducting layer or that of the n-type semiconducting layer.

As the detailed numerical value in this regard, it is preferably 100 Å to 10 μm and more preferably 0.1 to 1.0 μm.

The semiconducting layer 104 is an n-type semiconducting layer in the photoelectromotive force member shown in FIG. 1(A) and a p-type semiconducting layer in the photoelectromotive force member shown in FIG. 1(B)

Although the principal component is a-Si(H,X) in any case, the semiconducting layer in the FIG. 1(B) embodiment is composed of a-Si(H,X)(O,C,N) possessing a wide band gap since it is necessary for the so-called window effect.

The former semiconducting layer contains n-type dopant impurities and the latter semiconducting layer contains p-type dopant impurities.

In order to make the layer structure of the semiconducting layer possess a wide band gap, it is common that the p-type semiconducting layer is selected. However, it is possible to use the n-type semiconducting layer. The band gap of such a wide band gap layer is desired to be larger than that of the i-type semiconducting layer.

The electroconductive layer 105 may be of either transparent material or opaque material. Particularly when the substrate 101 is opaque as shown in FIG. 1(B) in which the radiation of light is conducted from the substrate 101 side, it is necessary for the electroconductive layer 105 to be optically transparent or nearly so in order for the photoelectromotive force member to give a sufficient photoelectric conversion effect.

As the transparent electroconductive material forming the electroconductive layer 105, there may be illustrated metal oxides such as $In_2O_3$, $SnO_2$ and ITO ($In_2O_3+SnO_2$), and metals such as Pd, Pt, Cu, Ag, Au and Al. As the opaque electroconductive materials forming the electroconductive layer 105, there may be illustrated alloys such as NiCr, and metals such as Al, Cr, Mo, Au, Ir, Nb, Ta, V, Ti, Pt, Pd, Zn, and Ag.

Regarding the photoelectromotive force member shown in FIG. 1(C) provided according to this invention, it has a structure composed of photoconductive layer 103, insulative layer 106 when necessary and metallic layer 107 on substrate 101.

As the substrate 101, those as above mentioned may be used. The photoconductive layer 103 is the same as in the case of FIG. 1(A) or FIG. 1(B).

For the metallic layer 107, a metal such as Au, Pt, Pd or the like which has a large work function is used in order to make a Schottky contact with the photoconductive layer 103. The formation of the metallic layer 108 on the substrate 101 may be conducted in accordance with a vacuum vapor deposition technique or an electron beam vapor deposition technique.

The thickness of the metallic layer 107 is preferred to be less than 500 Å, because light radiation to the photoconductive layer 103 is made through the metallic layer 107.

The insulative layer 106 reinforces the barrier between the photoconductive layer 103 and the metallic layer 107. Therefore it is not always necessary. Insulative layer 107 must be extremely thin, for example, less than 2000 Å.

When the insulative layer 106 is present in the photoelectromotive force member, it is preferred to be of wide band-gap.

The formation of the insulating layer 106 may be conducted by adding a gas containing nitrogen, such as $N_2$, $NH_3$, NO or $NO_2$, a gas containing oxygen, such as $O_2$ or $CO_2$, or a gas containing carbon, such as $CF_4$, $C_2F_6$ or $CH_4$, to either the foregoing substance (i) or the foregoing electronically oxidizing agent.

The photoelectromotive foce members as explained above which are provided according to this invention have a wealth of excellent electric and optical characteristics, deterioration resistance upon repeated use and use-environmental characteristics and have a higher photoelectric conversion efficiency, and are suited for use in photovoltaic devices.

The process for preparing an improved photoelectromotive force member having a particular photoelectric conversion layer according to this invention is characterized by (a) employing together a substance contributing to form a deposited film and an electronically oxidizing agent; (b) passing the substance in a gaseous state through a transportation space leading to a film forming space wherein a substrate for a photoelectric conversion layer is placed while being maintained at a predetermined temperature; (c) passing the electronically oxidizing agent in a gaseous state through another transportation space leading to the film forming space; and (d) chemically contacting the substance and the electronically oxidizing agent in the absence of a plasma in the space above the surface of the substrate, thereby generating a plurality of precursors containing excited precursors and causing at least one of those precursors to be directed to form a deposited film as a photoelectric conversion layer for the photoelectromotive force member.

According to this invention, there is provided an apparatus suitable for practicing the above process, characterized by a conduit for transporting a substance contributing to form a deposited film and a conduit for transporting an electronically oxidizing agent being so disposed that the substance and the electronically oxidizing agent may be smoothly introduced into the space positioned above the surface of a substrate for a photoelectric conversion layer maintained at a predetermined temperature in a film forming chamber and sufficiently contacting each other in the absence of a plasma thereby generating a plurality of precursors containing excited precursors and causing at least one type of these precursors be directed to form a desired deposited film for a photoelectric conversion layer for a photoelectromotive force member.

According to this invention, there can be obtained a desirable photoelectric conversion laver in a simole process in the absence of a plasma without having any negative influence due to plasma etching or any problem due to abnormal discharge actions since the process does not depend upon the conventional plasma CVD method using a gaseous plasma formed by subjecting the starting gaseous materials to the action of electrical discharge energy.

In addition, according to this invention, there are provided the following advantages; a desired photoelectric conversion layer for a photoelectromotive force member which has a uniform thickness and a desired homogeneity may be effectively formed at an improved film forming rate in simple procedures without consumption of as much energy as in the conventional plasma CVD method; the operating parameters for preparing a photoelectric conversion layer for an image-reading photosensor may be significantly simplified; an improved photoelectromotive member having such desirable photoelectric conversion layer or if necessary, of a large surface area may be mass-produced on an industrial scale to thereby reduce the cost of such product; and a heavy investment such as for the apparatus in the conventional plasma CVD method is not necessitated even for a particularly appropriate apparatus to practice the process of this invention.

The starting substance to be used as the foregoing substance contributing to form a photoelectric conversion layer for the photoelectromotive force member of this invention (hereinafter referred to as the term "starting substance A") means a substance which can be a reactant for forming said layer but which does not or essentially does not contribute to form said layer as long as it remains in its original energy state, as previously mentioned. However, it is required that the starting substance A be able to generate a plurality of precursors containing excited precursors when it is chemically contacted with the foregoing electronically oxidizing agent.

The starting substance A is chosen appropriately in accordance with the kind, the desired characteristics, and/or the intended purpose of the photoelectric conversion layer.

For the starting substance A, any gaseous, liquid, or solid substance may be used as long as it meets the above condition and can be easily made to be in the gaseous state when chemically contacted with said oxidizing agent.

When a liquid or solid substance is employed as the starting substance A, it is contacted with an inert gas such as Ar, He, $N_2$, or $H_2$ and, if necessary, while being heated to thereby generate a gas of the substance, which is then introduced into the film forming space.

For the foregoing electron oxidizing agent, a gaseous substance is used. The oxidizing agent must have the property of easily causing an excitation of the starting substance A due to electron oxidation action of the oxidizing agent from chemical contact between the two substances. Therefore, usable as such oxidizing agent are, for example, oxygen gases such as air, oxygen ($O_2$) and ozone ($O_3$), oxygen atom containing substances or nitrogen atom containing substances such as dinitrogen oxide ($N_2O$), dinitrogen trioxide ($N_2O_3$) and dinitrogen tetraoxide ($N_2O_4$), peroxides such as hydrogen peroxide ($H_2O_2$), halogen gases such as $F_2$, $Cl_2$, $Br_2$ and $I_2$, and nascent state halogens such as nascent fluorine, chlorine, and iodine.

In the case where a liquid or solid substance is chosen as the oxidizing agent, it is contacted with an inert gas such as Ar, He, $N_2$ or $H_2$ and if necessary, while being heated to thereby generate a gas of the substance, which is then introduced into the film forming space in the same manner as in the case of the starting substance A.

The aforementioned starting substance A and the aforementioned electronically oxidizing agent are introduced separately through respective transporting passages into a film forming space with an appropriate flow rate and under an appropriate pressure condition and collided with each other to cause chemical contact between the two substances thereby causing the starting substance to be electronically oxidized by the oxidizing agent to effectively generate a plurality of precursors containing excited precursors. At least one species of the resulting precursors is caused to form a deposited film for the photoelectric conversion layer on a substrate maintained at a predetermined temperature in the film forming space.

In the above film forming process, the excited precursor generated therein becomes another precursor or an other excited precursor through successive decomposition or chemical reaction, or it sometimes liberates energy. In any case, the excited precursor contacts the surface of the substrate maintained at a predetermined temperature in the film forming space and causes the formation of a deposited film having a three dimensional network structure on the substrate. In this system, the energy level of the excited precursor generated as a result of the chemical contact between the starting substance A and the oxidizing agent is preferred to be either such that it relaxes to a lower energy level or such that it is accompanied by a radiative emission during the process when the excited precursor is changed into other chemical species. Because the generation of a plurality of precursors containing such excited precursor is accompanied with an emission for its energy transition, the formation process of the photoelectric conversion layer effectively proceeds with a lower consumption of energy to thereby result in obtaining an improved photoelectromotive force member provided with a desirable photoelective conversion layer having a uniform thickness and a desirable homogeneity and having an excellent photoelectric conversion function.

The combination of the starting substance A and the electronically oxidizing agent is appropriately selected according to the kind of photoelectric conversion layer to be formed on the substrate.

For example, in the case of forming a semiconducting layer composed of a p-type a-Si(O,C,N)(H,X), as the starting substance A, in addition to a gaseous or gasifiable compound containing silicon atoms such as a silicon hydride (silane) i.e. $SiH_4$, $Si_2H_6$, $Si_3H_8$ and $Si_4H_{10}$ or a gaseous or gasifiable halogen-substituted silicon halide i.e. $SiH_3Cl$, $SiH_3Br$, and $SiH_3F$, there is used a gaseous or gasifiable compound containing nitrogen atoms such as $N_2$, $NH_3$, $H_2NNH_2$, and $NH_4N_3$ or a gaseous or gasifiable compound containing carbon atoms such as $CH_4$, $C_2H_2$, $C_2H_4$, $C_2H_6$, $C_3H_6$, and $C_3H_8$. In addition, as the substance to impart a p-type dopant impurity, there is used a compound containing a Group III element such as $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, and $In(CH_3)_3$.

As the electronically oxidizing agent, there is used at least one selected from the group consisting of a halogen gas such as $F_2$, $Cl_2$, $Br_2$, and $I_2$, a nascent state halogen such as nascent fluorine, chlorine and iodine, an oxygen gas such $O_2$ and $O_3$ and a nitrogenic gaseous substance such as $N_2O_4$, $N_2O_3$, and $N_2O$.

In the case of forming the i-type semiconducting layer composed of a-Si(O,C,N)(H,X), as the starting substance A, in addition to a gaseous or gasifiable compound containing silicon atoms selected from those silicon compounds as mentioned above, there is used at least one selected from the above mentioned compounds containing nitrogen atoms and the above mentioned compounds containing carbon atoms.

As the electronically oxidizing agent, there is used at least one selected from the above mentioned halogen gases, nascent state halogens, oxygen gases and gaseous nitrogenic substances.

Further, in the case of forming the n-type semiconducting layer composed of a-Si(H,X), as the starting substance A, there is used a gaseous or gasifiable compound containing silicon atoms selected from those silicon compounds as mentioned above together with a compound containing a Group V element to impart an n-type dopant impurity, such as $PH_2$, $P_2H_4$, $AsH_3$, $SbH_3$, and $BiH_3$.

And as the electronically oxidizing agent, there is used at least one selected from the above mentioned halogen ases, nascent state halogens, oxygen gases, and gaseous nitrogenic substances.

Further, in the case of forming the p-type, i-type, or n-type semiconducting layer composed of a-SiGe, as the starting substance A, there is additionally used linear germanium compound for incorporating germanium atoms, such as $GeH_4$ $Ge_2H_6$, $Ge_3H_8$, $Ge_4H_{10}$, and $Ge_5H_{12}$, in addition to the other starting substance A to be used in the layer formation.

In the process for preparing an improved photoelectromotive force member according to this invention, the conditions for forming the corresponding photoelectric conversion layer, for example, the combination of the starting substance A with the electronically oxidizing agent their mixing ratio, the gas pressure upon mixing those substances in the film forming space, their gas flow rates, the internal pressure upon forming the layer on the substrate, the carrier gas flow rate, the temperature of the substrate, and the flow type of each gaseous substance when introduced into the film forming space are important factors for obtaining a desirable layer having desired characteristics, and they are appropriately selected while considering the functions of the layer to be formed. Further, since these layer forming conditions are correlated and may be varied depending upon the kind and the amount of each of the atoms contained in the layer, the conditions are to be determined taking these relationships into consideration.

The volume ratio of the starting substance A to the electronically oxidizing agent on the basis of the flow ratio is preferably 1/100 to 100/1, and more preferably, 1/50 to 50/1.

The volume ratio of the gaseous substance containing the p-type impurity or the n-type impurity as its constituent to the starting substance A on the basis of the flow ratio is preferably $1/10^6$ to 1/10, more preferably, $1/10^5$ to 1/20, and most preferably, $1/10^5$ to 1/50.

The gas pressure in the film forming space when the starting substance A is mixed with the electronically oxidizing agent is preferred to be higher in order to facilitate their chemical contact. But it is necessary to be determined with due regard to their reactivities. Therefore, it is maintained preferably at $1 \times 10^{-7}$ to 10 atmospheres, and more preferably, $1 \times 10^{-6}$ to 3 atmospheres.

The internal pressure in the film forming space, namely, the pressure of the inner space wherein the substrate is placed is appropriately determined with due regard to the excited precursors to be generated in the above inner space and to the conditions necessary for those precursors derived from the excited precursors to become effective in forming a deposited layer.

The internal pressure in the film forming space in the case where the reaction region is open to the film forming region can be adjusted with the use of a differential exhausting means or a large scale exhausting device while having due regard to the correlated conditions relating to the inlet pressure and the inlet flow rate for each of the gaseous starting substance A, the electronic oxidizing agent, and the gaseous starting substance to impart a p-type or n-type impurity when they are introduced into the reaction region of the film forming space.

In the case where the gas flow rate of the connecting part between the reaction region and the film forming region is relatively small, the internal pressure in the film forming region can be adjusted by controlling the amount of the exhausting gas by operating an exhausting device connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming space is determined while having due regard for the correlated pressure conditions in introducing the starting substance A, the electronically oxidizing agent and the substance to impart p-type or n-type impurities into the film forming space, However, in general, the internal pressure is preferably 0.001 to 100 Torr, more preferably, 0.01 to 30 Torr, and most preferably, 0.05 to 10 Torr.

As for the form of the gas flows into the film forming space for each of the foregoing substances, they are appropriately designed with due regard to the geometrical arrangement of the gas flow inlet, the substrate and the gas flow outlet so that the starting substance A, the electronically oxidizing agent, and the substance to impart p-type or n-type impurities are effectively introduced into and homogeneously and well mixed in the predetermined region of the film forming space to generate desired precursors and to bring about the effective formation of a deposited film on the substrate.

The temperature of the substrate upon forming a deposited film thereon is properly determined according to the kind of gaseous substance to be employed and also to the kind of deposited film to be formed.

That is, in the case of forming a deposited film composed of an amorphous material, it is preferably room temperature to 450° C., more preferably, 50 to 350° C., and most preferably, 70° to 350° C.

The atmospheric temperature in the film forming space is properly determined with due regard to the temperature of the substrate so that desired precursors are effectively generated, and those precursors as generated and other precursors derived from the former precursors are not changed into undesired species during the film forming process in the film forming space.

The advantages of this invention are now described in more detail by reference to the following Examples 1 to 3, which are provided here for illustrative purposes only, and are not intended to limit the scope of this invention.

Figure 2:
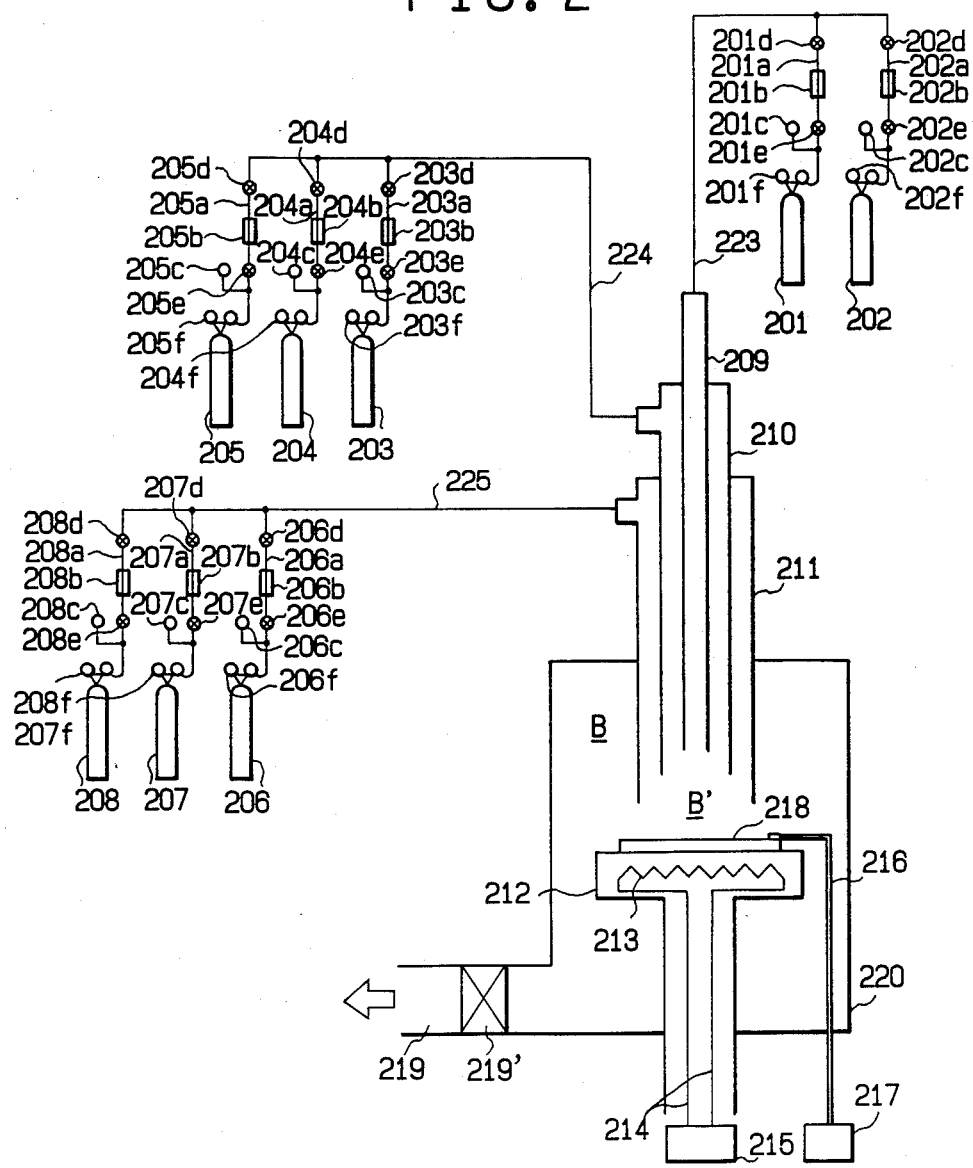
FIG. 2 is a schematic explanatory view of a fabrication apparatus as an example of the apparatus for preparing the photoelectromotive force member according to this invention.

In each of the examples, a corresponding layer of the photoelectric conversion device according to this invention is formed by using the fabrication apparatus as shown in FIG. 2.

The fabrication apparatus as shown FIG. 2 comprises a vacuum chamber having a film forming space with which a gas supplying system and a gas exhausting system are provided.

In FIG. 2, there are shown gas reservoirs 201 through 208, gas supply pipes 201a through 208a respectively extended from the gas reservoirs 201 through 208, mass flow controllers 201b through 208b being placed respectively on the gas supply pipes 201a through 208a for controlling the flow rate of gas from each of the gas reservoirs, pressure gages 201c through 208c main valves 201d through 208d, sub valves 201e through 208e, and gas reservoir pressure gages 201f through 208f.

With vacuum chamber 220, there are provided first gas supply conduit 209, second gas supply conduit 210 and third gas supply conduit 211 which are extended into a film forming space B of the vacuum chamber through its upper wall and whose ends leave a space B' sufficient to form a reaction region for a substrate 218 to be placed therein.

As for the first, second, and third gas supply conduits 209, 210, and 211, a concentric triple conduit having a first circular space which serves as the first gas supply conduit 209, a second circular space which serves as the second gas supply conduit 210, and a cylindrical space positioned in the middle which serves as the third gas supply conduit 211 is used.

The end portion of the concentric triple conduit in the film forming space B is desired to be of such a form providing an inwardly indented surface with leaving a round space B' acting as the reaction region. The outlet of each of the gas supplying conduits 209, 210, and 211 is downwardly opened at the inwardly indented surface.

As an alternative, the end portion of the concentric triple conduit may be structured in such a way that the outlet of the third gas supply conduit 211 of cylindrical form is positioned in the innermost recess and the remaining end portion composed of the outlets of the first and second gas supply conduits is in a diagonally cut surface form so as to leave a space in the form of conic trapezoid B' acting as the reaction region.

To the first gas supply conduit 209, a gas feed pipe 223 for the gas from the gas reservoirs 201 and 202 is connected. To the second gas supplying conduit 210, a gas feed pipe 224 for the gas from the gas reservoirs 203, 204, and 205 is connected. And to the third gas supplying conduit, a gas feed pipe 225 for the gas from the gas reservoirs 206, 207, and 208 is connected.

At the bottom part of the vacuum chamber 220 there is provided an exhaust pipe 219 having a vacuum valve 219. The exhaust pipe 219 is connected to an exhaust device (not shown).

The air or gas in the gas feed pipes 223, 224, and 225, the gas supply conduits 209, 210, and 211; and the vacuum chamber 220 can be evacuated by operating the exhaust device through the exhaust pipe 219.

The substrate 218 is placed on substrate holder 212 which can be shifted upwardly or downwardly with a driving means (not shown), and in which a heater 213 is installed.

The heater 213 is electrically connected to an electric power source 215 through lead wires 214. In order to measure the temperature of the substrate 218, there is provided a thermocouple 216 electrically connected to a temperature indicator 217.

The position of the substrate 218 upon forming a deposited film thereon is appropriately adjusted by shifting the substrate holder 212 so that there is left a desired distance between the surface of the substrate 218 and the outlets of the gas supplying conduits 209, 210, and 211.

Such desired distance is determined depending upon the kind of a deposited film to be formed, its desired characteristics, the flow rate of a gas to be employed, the internal pressure in the vacuum chamber and the like.

However, in general, it is preferably several millimeters to 20 cm. and more oreferablv 5 mm to 15 cm.

The heater 213 is operated usually to heat the substrate 218 to an appropriate temperature or to conduct a preliminary heat treatment of the substrate. However, the heater 213 can be used to anneal the deposited film formed on the substrate.

EXAMPLE 1

A photoelectromotive force member of the type as shown in FIG. 1(A) was prepared using the apparatus shown in FIG. 2.

In this example, the distance between the outlet of the gas supplying conduit 211 of the concentric triple conduit and the surface of the substrate 218 was adjusted to be 3 cm.

As the substrate 218, a glass plate of 1 mm in thickness and 10 cm $\times$ 5 cm in size on which an $SnO_2$ film of 1000 Å in thickness was formed according to CVD method was used.

This glass plate was firmly disposed on the surface of the substrate holder 212 placed at the predetermined position in the vacuum chamber 220.

The air in the film forming space B was evacuated by opening the vacuum valve 219' to bring the space to a vacuum of about $10^{-5}$ Torr. Then, the heater 213 was actuated to uniformly heat the glass plate (substrate) 218 to 250° C., and the plate was maintained at this temperature.

Under this condition, a p-type semiconducting layer composed of a-SiC:H:F:B was firstly formed by using $SiH_4$ gas and $CH_4$ gas as the starting substance A, $B_2H_6$ gas diluted with He gas ($B_2H_6/H_2=3000$ ppm) as the substance to impart p-type impurities, and $F_2$ gas as the electronically oxidizing agent.

That is, $SiH_4$ gas from the reservoir 201 and $CH_4$ gas from the reservoir 202 were fed into the reaction region B' through the gas supplying conduit 209 respectively at a flow rate of 20 SCCM and of 3 SCCM. And, a gas containing 3000 ppm of $B_2H_6$, in He gas (hereinafter referred to as "$B_2H_6$/He gas") from the reservoir 203 was fed into the reaction region B' through the gas supplying conduit 210 at a flow rate of 10 SCCM.

At the same time, He gas from the reservoir 207 was fed into the reaction region B' through the gas supplying conduit 211 at a flow rate of 30 SCCM.

After the flow amount of the gases became stable, the vacuum in the vacuum chamber 220 was brought to and maintained at about 0.8 Torr by regulating the vacuum valve 219'. Then, $F_2$ gas from the reservoir 206 was fed into the reaction region B' through the gas supplying conduit 211 at a flow rate of 2 SCCM. There was observed a strong blue luminescence particularly in the region where $SiH_4$ gas and $F_2$ gas was mixed.

After 4 minutes, it was found that a p-type a-SiC:H:F:B semiconducting layer of about 300 Å in thickness was uniformly formed on the $SnO_2$ layer previously formed on the substrate.

Secondly, an i-type semiconducting layer composed of a-Si:H:F was formed on the p-type a-SiC:H:F:B semiconducting layer by using $SiH_4$ gas as the starting substance A and $F_2$ gas as the electronically oxidizing agent.

That is, by closing the valves 202d and 202e on the pipe 202a for $CH_4$ gas and the valves 203d and 203e on the pipe 203a for $B_2H_6$/He gas, the feed of $SiH_4$ gas, $F_2$ gas, and He gas was continued while not changing their former flow rates and maintaining the vacuum in the vacuum chamber 220 at about 0.8 Torr.

After 1 hour, it was found that an i-type semiconducting layer composed of a-Si:H:F of about 5000 Å in thickness was uniformly formed on the p-type a-SiC:H:F:B semiconducting layer.

Finally, an n-type semiconducting layer composed of a-Si:H:F:P was formed on the i-type a-Si:H:F semiconducting layer by using $SiH_4$ gas as the starting substance A, $PH_3$ gas as the substance to impart n-type dopant impurities, and $F_2$ gas as the electronically oxidizing agent.

That is, a gas containing 5000 ppm of $PH_3$ in He gas (hereinafter referred to as "$PH_3$/He gas") from the reservoir 204 was fed into the reaction region B' through the gas supply conduit 210 at a flow rate of 10 SCCM while the feedings of $SiH_4$ gas, $F_2$ gas and He gas was continued and the vacuum in the vacuum chamber 220 maintained at about 0.8 Torr.

After 6 minutes, it was found that an n-type semiconducting layer composed of a-Si:H:F:P of about 500Å, was uniformly formed on the i-type a-Si:H:F semiconducting layer.

The feed of all the gases was terminated by closing the corresponding valves, and the vacuum atmosphere in the vacuum chamber 220 was opened to atmospheric pressure by opening the vacuum valve 219'.

After the glass plate having three kinds of semiconducting layers thereon was cooled to room temperature, it was removed from the vacuum chamber 220.

The glass plate was then placed in another vacuum chamber (not shown), and a comb shaped Al electrode of about 500 Å in thickness was formed on the surface of the top layer of the glass plate in accordance with a conventional vacuum deposition method to obtain a photovoltaic device of p-i-n type as shown in FIG. 1(A).

When the resulting photovoltaic device was examined, it was found that each of the layers as formed on the glass plate is uniform and homogenous and has many practically applicable characteristics.

Further, when the resulting photovoltaic device was examined by irradiating a light of AM-1 100 mW/cm$^2$ from the side of the glass plate, it was found that the photovoltaic device has excellent photovoltaic characteristics; 0.80 V for open circuit voltage, 18 mA/cm$^2$ for short circuit current, and 8.0% for photoelectric conversion efficiency.

EXAMPLE 2

Figure 3:
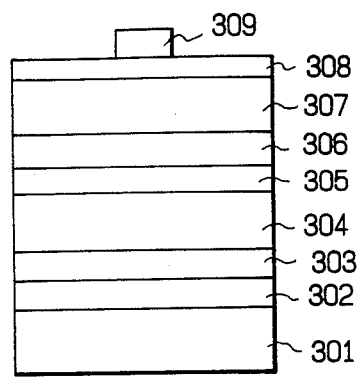
FIG. 3 is a cross sectional view of a photovoltaic device provided with a multi-layered semiconducting layer of a p-i-n-p-i-n type which is provided according to this invention.

In this example, a multi-layered photovoltaic device of the p-i-n-p-i-n-type as shown in FIG. 3 was prepared using the apparatus shown in FIG. 2.

Referring to FIG. 3, there are shown glass plate 301, transparent electrode 302, p-type semiconducting layers 303 and 306, i-type semiconducting layers 304 and 307, n-type semiconducting layers 305 and 308, and Al electrode 309 respectively.

As the substrate, a glass plate 301 on which an SnO$_2$ layer 302 of about 1000 Å in thickness had been formed in accordance with a conventional CVD method was used.

This glass plate was firmly disposed on the surface of the substrate holder 212 placed at the predetermined position in the vacuum chamber 220.

The air in the film forming space B was evacuated by opening the vacuum valve 219' to bring the space to a vacuum of about 10$^{-5}$ Torr. Then, the heater 213 was actuated to uniformly heat the glass plate (substrate) 218 to 250° C., and the glass plate was maintained at this temperature.

Under these conditions, SiH$_4$ gas from the reservoir 201 and CH$_4$ gas from the reservoir 202 were fed into the reaction region B' through the gas supply conduit 209 at respective flow rates of 20 SCCM and 3 SCCM. A gas containing 3000 ppm of B$_2$H$_6$ gas in He gas (hereinafter referred to as "B$_2$H$_6$/He gas") was fed into the reaction region B' through the gas supply conduit 210 at a flow rate of 10 SCCM.

At the same time, He gas from the reservcir 207 was fed into the reaction region B' through the gas supply conduit 211 at a flow rate of 30 SCCM.

After the flow amount of the gases became stable, the vacuum in the vacuum chamber 220 was brought to and maintained at about 0.8 Torr by regulating the vacuum valve 219'.

Then, F$_2$ gas from the reservoir 206 was fed into the reaction region B' through the gas supply conduit 211 at a flow rate of 2 SCCM. A strong blue luminescence was observed in the region where SiH$_4$ gas and F$_2$ gas were mixed.

After 4 minutes, it was found that a p-type a-SiC:H:F:B semiconducting layer 303 of about 300 Å in thickness was uniformly formed on the surface of the SnO$_2$ layer 302.

Then, closing the valves 202d and 202e on the pipe 202a for CH$_4$ gas and the valves 203d and 203e on the pipe 203a for B$_2$H$_6$/He gas, the feed of SiH$_4$ gas, F$_2$ gas and He gas was continued for 12 minutes without changing their former flow rates.

As a result, it was found that an i-type a-SiC:H:F semiconducting layer 304 of about 1000 Å in thickness was uniformly formed on the surface of the p-type a-SiC:H:F:B semiconducting layer 303.

Next, the feed of B$_2$H$_6$/He gas was terminated, and while the feed of SiH$_4$ gas, F$_2$ gas, and He gas was continued without changing their flow rates, a gas containing 5000 ppm of PH$_3$ gas in He gas (hereinafter referred to as "PH$_3$/He gas") from the reservoir 204 was fed into the reaction region B' through the gas supply conduit 210 at a flow rate of 10 SCCM.

After 6 minutes, it was found that an n-type a-Si:H:F:P semiconducting layer 305 of about 5000 Å in thickness was uniformly formed on the surface of the i-type a-Si:H:F semiconducting layer 304.

Thereafter, the feed of all the gases was terminated by closing the corresponding valves therefor, and the residual gases in the vacuum chamber 220 were evacuated by opening the vacuum valve 219'.

Then, SiH$_4$ gas from the reservoir 201 and B$_2$H$_6$/He gas from the reservoir 203 were respectively fed into the reaction region B' through the gas supplying conduits 209 and 210 at respective flow rate of 20 SCCM and 10 SCCM. At the same time, He gas from the reservoir 207 was fed into the reaction region B' through the gas supply conduit 211 at a flow rate of 30 SCCM.

After the flow amount of the gases became stable, the vacuum in the vacuum chamber 220 was brought to and maintained at about 0.8 Torr by regulating the vacuum valve 219'. Then, F$_2$ gas from the reservoir 206 was fed into the reaction region through the gas supply conduit 211 at a flow rate of 2 SCCM. After 4 minutes, it was found that a p-type a-S::H:F:B semiconducting layer 306 of about 300 Å was uniformly formed on the surface of the previous n-type a-Si:H:F:P semiconducting layer 305.

Thereafter, by closing the valves 203d and 203e on the pipe 203a for B$_2$H$_6$/He gas, but continuing the feed of SiH$_4$ gas, F$_2$ gas and He gas respectively at flow rates of 20 SCCM, 3 SCCM, and 30 SCCM, GeH$_4$ gas from the reservoir 205 was fed into the reaction region B' through the gas supply conduit 210 at a flow rate of 3 SCCM.

After 45 minutes, it was found that an i-type a-SiGe:H:F semiconducting layer 307 of about 5000 Å in thickness was uniformly formed on the surface of the previous p-type a-Si:H:F:B semiconducting layer 306.

Next, while the feed of SiH$_4$ gas, F$_2$ gas, He gas, and GeH$_4$ gas was continued without changing their flow rates, a gas containing 5000 ppm of PH$_3$ gas in He gas was fed from the reservoir 204 into the reaction region B. through the gas supply conduit 210 at a flow rate of 10 SCCM.

After 5 minutes, it was found that an n-type a-SiGe:H:F:P semiconducting layer 308 of about 500 Å in thickness was uniformly formed on the previous i-type a-SiGe:H:F semiconducting layer.

Finally, the feed of all the gases was terminated by closing the corresponding valves, and the vacuum atmosphere in the vacuum chamber 220 was opened to atmospheric pressure by opening the vacuum valve 219'. After the glass plate having layers 302 to 308 thereon was cooled to room temperatures, it was taken out from the vacuum chamber 220. The glass plate was then placed in another vacuum chamber (not shown), and an Al electrode 309 of about 5000 Å in thickness and 1 cm × 1 cm in size was formed on the surface of the top layer 308 in accordance with a conventional vacuum deposition method. As a result, there was obtained a photovoltaic device having a p-i-n-p-i-n multi-layered structure on the surface of the $SnO_2$ layer on the glass plate 301.

When the resulting photovoltaic device was examined by irradiating a light of AM-1 100 mW/cm$^2$ from the side of the glass plate 301, it was found that it has excellent photovoltaic characteristics; 1.4 V for open circuit voltage, 10 mA/cm$^2$ for short-circuit current, and 8.5% for photoelectric conversion efficiency.

EXAMPLE 3

Figure 4:
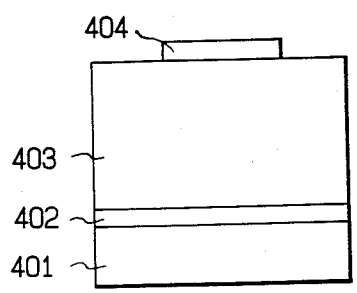
FIG. 4 is a cross sectional view of a photovoltaic device provided with a semiconducting layer having a graded band gap according to this invention.

In this example, a photovoltaic device possessing a graded band gap of the type as shown FIG. 4 was prepared using the apparatus shown in FIG. 2.

Referring to FIG. 4, there are shown glass a plate (substrate) 401, transparent electrode 402, semiconducting layer 403 possessing a graded band gap and Al electrode 404.

As the substrate, a glass plate 401 on which an $SnO_2$ layer 402 of about 1000 Å in thickness had been formed in accordance with a conventional CVD method was used.

This glass plate was firmly disposed on the surface of the substrate holder 212 placed at the predetermined position in the vacuum chamber 220.

The air in the film forming space B was evacuated by opening the vacuum valve 219' to bring the space to a vacuum of about $10^{-5}$ Torr. Then, the heater 213 was actuated to uniformly heat the glass plate (substrate) 218 to 250° C., and the glass plate was maintained at this temperature.

Under these conditions, $SiH_4$ gas from the reservoir 201 and $CH_4$ gas from the reservoir 202 were fed into the reaction region B' through the gas supply conduit 209 at respective flow rate of 20 SCCM and 3 SCCM. Concurrently, a gas containing 3000 ppm of $B_2H_6$ gas in He gas (hereinafter referred to as "$B_2H_6$/He gas") from the reservoir 203 was fed into the reaction region B' through the gas supply conduit 210 at a flow rate of 10 SCCM. Further, at the same time, He gas from the reservoir 207 was fed into the reaction region B' through the gas supply conduit 211 at a flow rate of 30 SCCM.

After the flow amount of the gases became stable, the vacuum in the vacuum chamber 220 was brought to and maintained at about 0.8 Torr by regulating the vacuum valve 219'. Thereafter, $F_2$ gas from the reservoir 206 was fed into the reaction region B' through the gas supply conduit 211 at a flow rate of 2 SCCM.

There was observed a strong blue luminescence in the area near the outlets of the gas supplying conduits 209, 210, and 211 in the reaction region B' where the above gases were mixed.

In the above process, at the same time when the feeding of $F_2$ gas started, the flow rates of both $CH_4$ gas and $B_2H_6$/He gas were controlled to automatically decrease linearly by respective rates of about 0.1 SCCM per minute and a rate of about 0.3 SCCM per minute so as to vanish after 35 minutes had elapsed since the feeding of $F_2$ gas started by adjusting the respective mass flow controllers 202b for $CH_4$ gas and 203b for $B_2H_6$/He gas.

Thereafter, while continuing the feed of $F_2$ gas, $GeH_4$ gas from the reservoir 205 and a gas containing 5000 ppm of $PH_3$ in He gas (hereinafter referred to as "$PH_3$/He gas") from the reservoir 204 were fed into the reaction region B' through the gas supply conduit 210.

In the above process, the flow rate of $GeH_4$ gas was linearly increased at a rate of about 0.1 SCCM per minute starting from a zero level and that of $PH_3$/He gas was also linearly increased at a rate of about 0.3 SCCM per minute starting from a zero level. The feed of $GeH_4$ gas and $PH_3$/He gas was continued for 35 minutes, and thereafter the flow rate of $GeH_4$ and that of $PH_3$/He gas were adjusted to 3 SCCM and 1 SCCM respectively.

Figure 6:
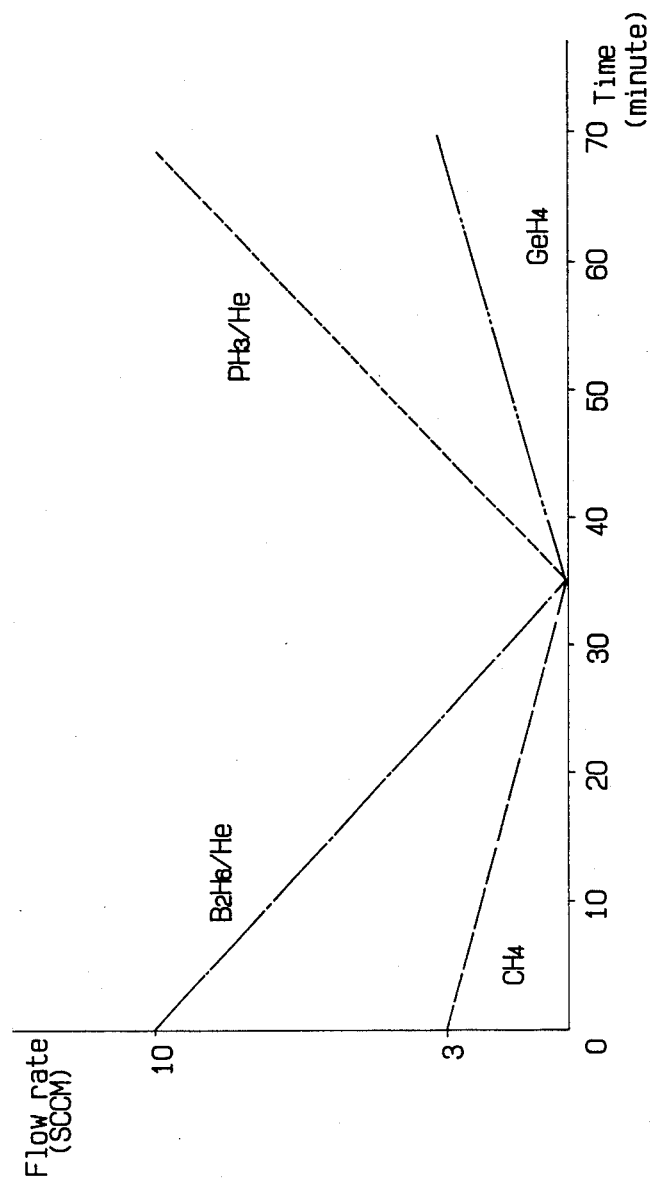
FIG. 6 illustrates the variations in the gas flow rate in forming a semiconducting layer in the photovoltaic device as shown in FIG. 4.

FIG. 6 is to illustrates the variations in the flow rates of $CH_4$ gas, $B_2H_6$/He gas. $GeH_4$ gas and $PH_3$He gas in this example, in which the line: ——— represents the flow rate for $CH_4$ gas, the line: ——·——— represents the flow rate for $B_2H_6$/He gas, the line: ——··——— represents the flow rate for $GeH_4$ gas, and the line: ——— — represents the flow rate for $PH_3$/He gas respectively.

70 minutes after the feed of $F_2$ gas started, the feed of all the gases was terminated by closing the corresponding valves, the heater 213 was switched off, and the vacuum atmosphere in the vacuum chamber 220 was opened to atmospheric pressure.

As a result, it was found that a semiconducting layer composed of a-Si(C,Ge):H:F:(B,P) 403 possessing a graded band gap which had a thickness of about 7000 Å was uniformly formed on the surface of the $SnO_2$ layer 402.

Figure 5:
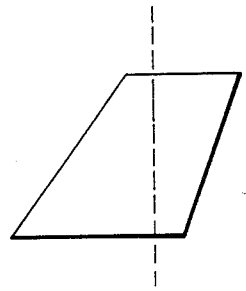
FIG. 5 is a schematic explanatory view of the structure of the band gap of the semiconducting layer in the photovoltaic device as shown in FIG. 4.

FIG. 5 is a schematic explanatory view of the structure of the graded band gap which the resulting a-Si(C,Ge):H:F:(B,P) semiconducting layer possesses.

The glass plate 218 having the layers 402 and 403 thereon was removed from the vacuum chamber 220. The glass plate was then placed in another vacuum chamber (not shown), and an Al electrode 404 of about 5000 Å in thickness and 1 cm × 1 cm in size was formed on the surface of the top layer 403 to obtain a desired photovoltaic device of the type as shown in FIG. 4 which has the a-Si(C,Ge):H:F:(B,P) semiconducting layer 403 possessing a graded band gap.

When the resulting photovoltaic device was examined by irradiating light of AM-1 100 mW/cm$_2$ from the side of the glass plate 401, it was found that the photovoltaic device has excellent photovoltaic characteristics; 0.80 V for open circuit voltage, 16 mA/cm$^2$ for short-circuit current, and 8.0% for photoelectric conversion efficiency.

What we claim is:

1. In the process for preparing an improved photoelectric force member having a substrate having a conductive surface, a photoelectric conversion layer formed from a film of non-single crystalline semi-conductive material desposited on the conductive surface of the substrate and a conductive layer on said photoelectric conversion layer, the improvement which comprises:

(a) introducing via a first gas transportation conduit into an evacuated film-forming space having said substrate therein gaseous substance (i) capable of being a constituent for said film, but essentially incapable of contributing to the formation of said film in its original energy state; and separately through a second gas transportation conduit concentric with said first gas transportation conduit a gaseous substance (ii) capable of oxidizing the substance (i) said first and second concentric gas transportation conduits terminating adjacent said substrate;

(b) chemically contacting said gaseous substances (i) and (ii) in the absence of a plasma in the space adjacent the surface of said substrate; said substrate being maintained at an elevated temperature to generate a plurality of precursors containing excited precursors and to cause at least one of said precursors to form the film constituting the photoelectric conversion layer; and (c) maintaining the distance between the outlet of said first and second concentric gas transportation conduits and the surface of the substrate from 5 mm to 15 cm.

2. The process of claim 1 wherein the gaseous substance (i) contains silicon atoms.

3. The process of claim 1 wherein the gaseous substance (i) contains silicon atoms and either a chemical element for imparting p-type conductivity or a chemical element for imparting n-type conductivity.

4. The process of claim 1 wherein the chemical contacting of said substances (i) and (ii) and the formation of said deposited film occur in a luminescent atmosphere.

5. The process of claim 1 wherein said gas transportation conduit is a concentric triple conduit having open ends facing the surface of the substrate.

6. The process of claim 1 wherein said gas transportation conduit is a concentric triple conduit having open ends facing the substrate, wherein the middle end is positioned in the inner most recess encircled by two other ends so as to form a circular space or a conic trapezoidal space.

* * * * *

UNITED STATES PATENT AND TRADEMARK OFFICE
CERTIFICATE OF CORRECTION

PATENT NO. : 4,798,809
DATED : January 17, 1989
INVENTOR(S) : MASAAKI HIROOKA, ET AL.    Page 1 of 4

It is certified that error appears in the above-identified patent and that said Letters Patent is hereby corrected as shown below:

Title page:

IN [56] REFERENCES CITED

Primary Examiner, "Aaron Weisstuck" should read --Aaron Weisstuch--.

COLUMN 1

Line 8, "preparinq" should read --preparing--.
    Line 13, "non crystalline" should read --non-crystalline--.
    Line 15, "so called" should read --so-called--.
    Line 36, "use environmental" should read --use-environmental--.

COLUMN 2

Line 46, "Conseguently" should read --Consequently--.
    Line 68, "above mentioned" should read --above-mentioned--.

UNITED STATES PATENT AND TRADEMARK OFFICE
CERTIFICATE OF CORRECTION

PATENT NO. : 4,798,809
DATED : January 17, 1989
INVENTOR(S) : MASAAKI HIROOKA, ET AL.   Page 2 of 4

It is certified that error appears in the above-identified patent and that said Letters Patent is hereby corrected as shown below:

COLUMN 3

Line 18, "film forming" should read --film-forming--.
Line 27, "cross sec-" should read --cross-sec- --.
Line 38, "cross sectional" should read --cross-sectional--.
Line 45, "cross sectional" should read --cross-sectional--.
Line 49, "cross sectional" should read --cross-sectional--.

COLUMN 5

Line 52, "so" should read --so- --.
Line 55, "band gap" should read --band-gap--.

COLUMN 6

Line 35, "by a Si(H,X)" should read --by a-Si(H,X)--.
Line 62, "1(B)" should read --1(B).--.
Line 67, "window effect." should read --window-effect.--.

COLUMN 10

Line 20, "$Si_3H_8$ and" should read --$Si_3H_8$, and--.
Line 60, "halogen ases," should read --halogen gases--.

UNITED STATES PATENT AND TRADEMARK OFFICE
CERTIFICATE OF CORRECTION

PATENT NO. : 4,798,809
DATED : January 17, 1989
INVENTOR(S) : MASAAKI HIROOKA, ET AL.   Page 3 of 4

It is certified that error appears in the above-identified patent and that said Letters Patent is hereby corrected as shown below:

COLUMN 11

Line 6, "agent" should read --agent,--.

COLUMN 12

Line 54, "sub valves 201e" should read
        --sub-valves 201e--.
    Line 58, "conduit 210" should read --conduit 210,--.

COLUMN 17

Line 1, "B." should read --B'--.
    Line 31, "band gap" should read --band-gap--.

COLUMN 18

Line 25, "1 SCCM" should read --10 SCCM--.

UNITED STATES PATENT AND TRADEMARK OFFICE
CERTIFICATE OF CORRECTION

PATENT NO. : 4,798,809

DATED : January 17, 1989

INVENTOR(S) : MASAAKI HIROOKA, ET AL.   Page 4 of 4

It is certified that error appears in the above-identified patent and that said Letters Patent is hereby corrected as shown below:

COLUMN 19

Line 5, "gaseous" should read --a gaseous--.

COLUMN 20

Line 21, "inner most" should read --innermost--.

Signed and Sealed this

Seventeenth Day of April, 1990

Attest:

HARRY F. MANBECK, JR.

*Attesting Officer*     *Commissioner of Patents and Trademarks*